United States Patent [19]
Nishi

[11] Patent Number: 5,311,893
[45] Date of Patent: May 17, 1994

[54] CLEANING APPARATUS

[75] Inventor: Mitsuo Nishi, Kurume, Japan

[73] Assignees: Tokyo Electron Limited, Tokyo; Tokyo Electron Saga Limited, Tosu, both of Japan

[21] Appl. No.: 111,473

[22] Filed: Aug. 25, 1993

Related U.S. Application Data

[62] Division of Ser. No. 880,543, May 8, 1992, Pat. No. 5,265,632.

[30] Foreign Application Priority Data

May 8, 1991 [JP] Japan .................. 3-131672
May 13, 1991 [JP] Japan .................. 3-135302

[51] Int. Cl.$^5$ .............................. B08B 3/02
[52] U.S. Cl. ..................... 134/95.2; 134/104.1; 134/902
[58] Field of Search ............ 134/78, 95.2, 104.1, 134/902; 118/70

[56] References Cited

U.S. PATENT DOCUMENTS

| | | |
|---|---|---|
| 4,715,392 | 12/1987 | Abe et al. ........................ 134/902 |
| 4,924,892 | 5/1990 | Kiba et al. ...................... 118/70 X |
| 4,936,328 | 6/1990 | Yatabe ............................ 134/902 |
| 5,127,363 | 7/1992 | Nakamura et al. ............ 134/104.1 |

FOREIGN PATENT DOCUMENTS 64-12534  1/1989  Japan .................... 134/902

Primary Examiner—Frankie L. Stinson
Attorney, Agent, or Firm—Oblon, Spivak, McClelland, Maier & Neustadt

[57] ABSTRACT

A cleaning apparatus includes a cleaning unit provided with cleaning tubs in which cleaning liquid is contained, and a carrying mechanism for carrying matters to be processed into and out of the cleaning unit. The carrying mechanism has holding members for holding the matters thereon. The cleaning apparatus further includes a chamber in which the carrying mechanism is housed, and a cleaning/drying system arranged in an upper portion of the chamber to clean and dry the matters-holding members of the carrying mechanism. The cleaning/drying system has cleaning and drying nozzles through which cleaning liquid and drying air are jetted against the matters-holding members of the carrying mechanism.

11 Claims, 10 Drawing Sheets

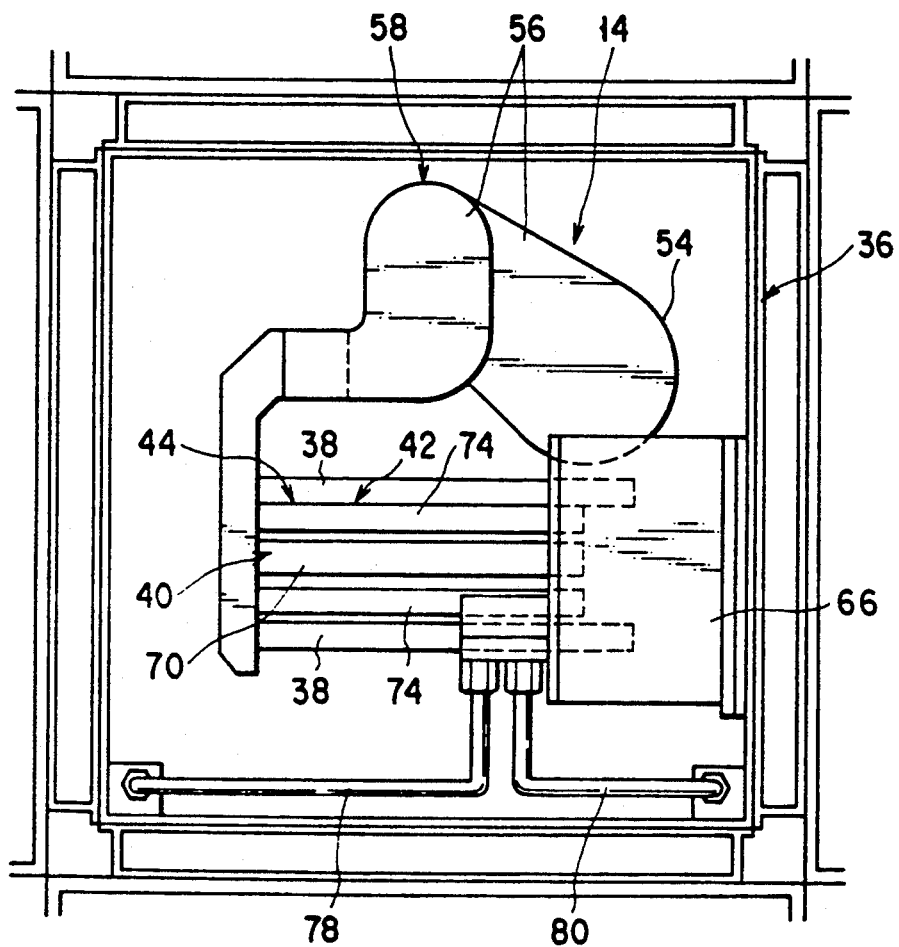
F I G. 3

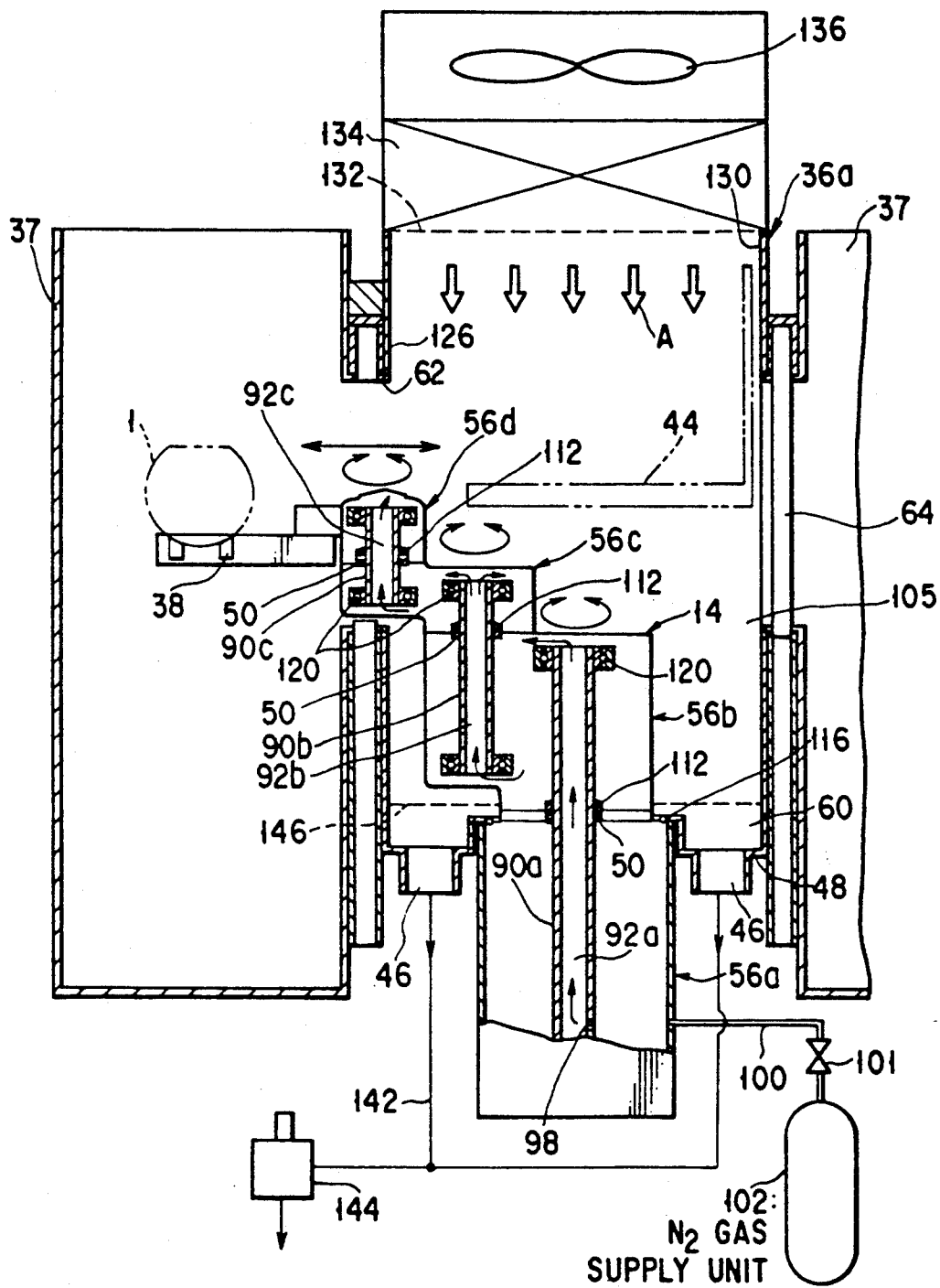
F I G. 6

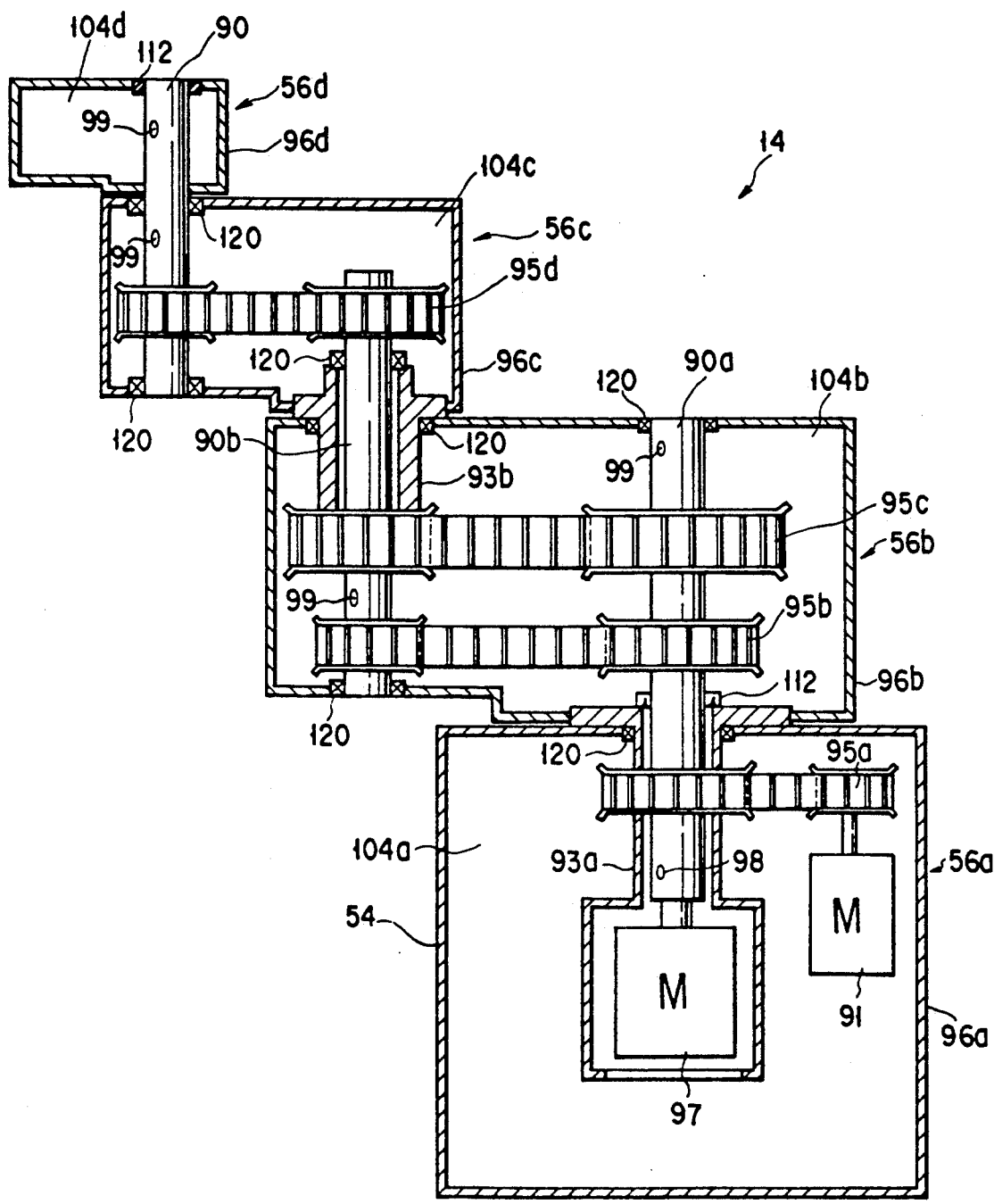
F I G. 9

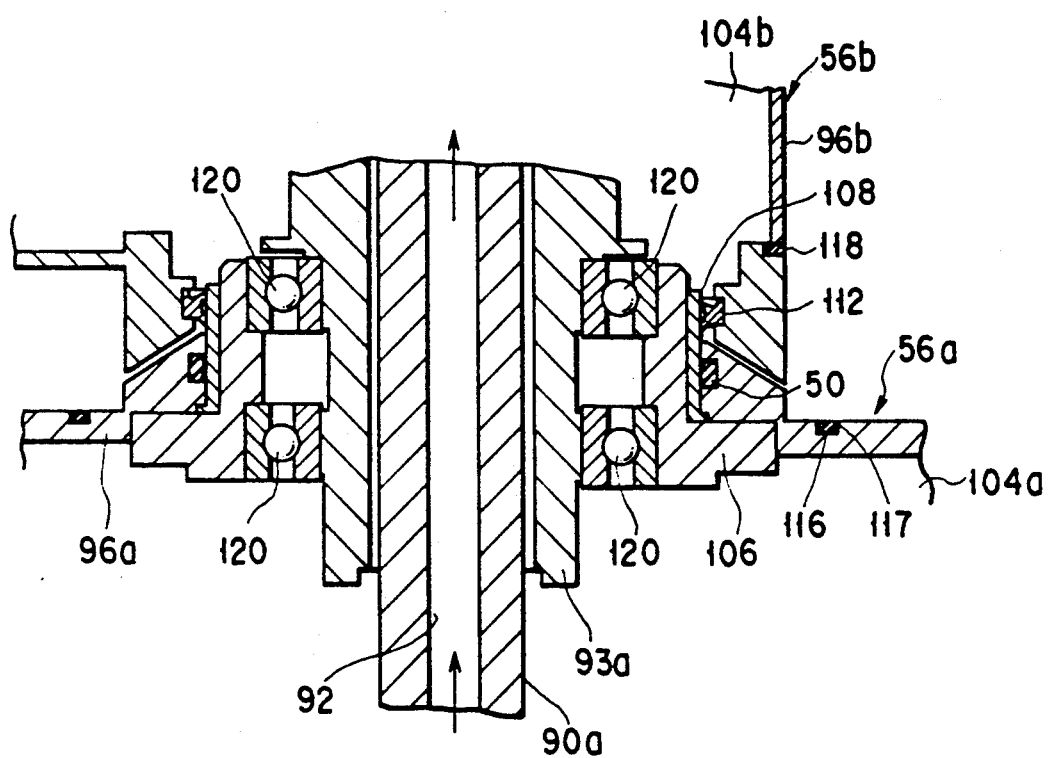
F I G. 10

CLEANING APPARATUS

This is a division of application Ser. No. 07/880,543, filed on May 8, 1992 now U.S. Pat. No. 5,265,632.

BACKGROUND OF THE INVENTION

1. Field of the Invention

The present invention relates to a cleaning apparatus and, more particularly, it relates to a cleaning apparatus wherein matters such as semiconductor wafers to be processes are carried to cleaning units by carrying robot arms and immersed in and cleaned by cleaning liquids in the cleaning units.

2. Description of the Related Art

The cleaning apparatus is usually used in the semiconductors manufacturing process to remove cleaning liquid and other impurities, which have adhered to surfaces of semiconductor wafers, from the wafers. This cleaning apparatus is intended to make the surfaces of semiconductor wafers clean by successively applying ammonia-treating, water-washing and hydrofluoric acidtreating steps to the wafers.

The conventional cleaning apparatus, therefore, has plural cleaning units in each of which ammonia-treating, water-washing and hydrofluoric acid-treating tubs are housed. Matters such as semiconductor wafers to be processed are held and carried into and out of the cleaning units by carrying systems. Each of the treating tubs is enclosed by a wall in this case so as to prevent atmosphere in each of the cleaning units from leaking outside. The chamber thus formed is provided with openings through which the semiconductor wafers are carried into and out of the chamber.

In the case of this cleaning apparatus, however, the carrying system or robot carries the semiconductor wafers into and out of the cleaning units or chambers whose atmospheres are different from each other. This causes medicines used at previous steps and dust and impurities to sometimes adhere to the carrying system. The semiconductor wafers carried can be, therefore, contaminated by these medicines, dust and impurities and this adds undesired influences to electrical characteristics of semiconductor circuits thus formed.

SUMMARY OF THE INVENTION

An object of the present invention is therefore to provide a cleaning apparatus wherein medicines and impurities stuck can be removed from its carrying system to keep it clean at all times and to enable matters-to-beprocessed to be carried under this state by it.

Another object of the present invention is to prevent drive sections of the carrying system from being corroded.

These objects of the present invention can be achieved by a cleaning apparatus comprising a cleaning unit provided with cleaning tubs in which cleaning liquid is contained; means for carrying matters to be processed into and out of the cleaning unit and provided with matters-holding members; a chamber in which the carrying means is housed; and means located in an upper portion of the chamber to clean and dry the mattersholding members of the carrying means, the cleaning and drying means including cleaning and drying nozzles through which cleaning liquid and dried air are jetted against the matters-holding members of the carrying means.

They can also be achieved by a cleaning apparatus comprising cleaning unit provided with cleaning tubs in which cleaning liquid is contained; and means for carrying matters to be processed into and out of the cleaning unit; wherein the carrying means includes plural arm segments connected freely swingable to one another and made by hollow air-tight blocks, means for driving the arm segments, means housed in the hollow blocks to transmit drive force to the arm segments, means for supplying pressurized gas into one of the hollow blocks, and means for distributing the pressurized gas into the other hollow blocks to keep all of them pressurized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is a plan, partly sectioned, showing the wafer transfer chamber;

FIG. 6 schematically shows a clean air supply system and a transfer robot arm in the case of the cleaning apparatus;

FIG. 9 is a partly sectioned view showing an inside arrangement of the transfer robot arm; and FIG. 10 is a sectional view showing a coupling section of the transfer robot arm.

DETAILED DESCRIPTION OF THE PREFERRED EMBODIMENTS

An embodiment of the present invention will be described with reference to the accompanying drawings. The present invention will be applied, in this case, to the cleaning apparatus used in the course of making semiconductor wafers.

Figure 1:
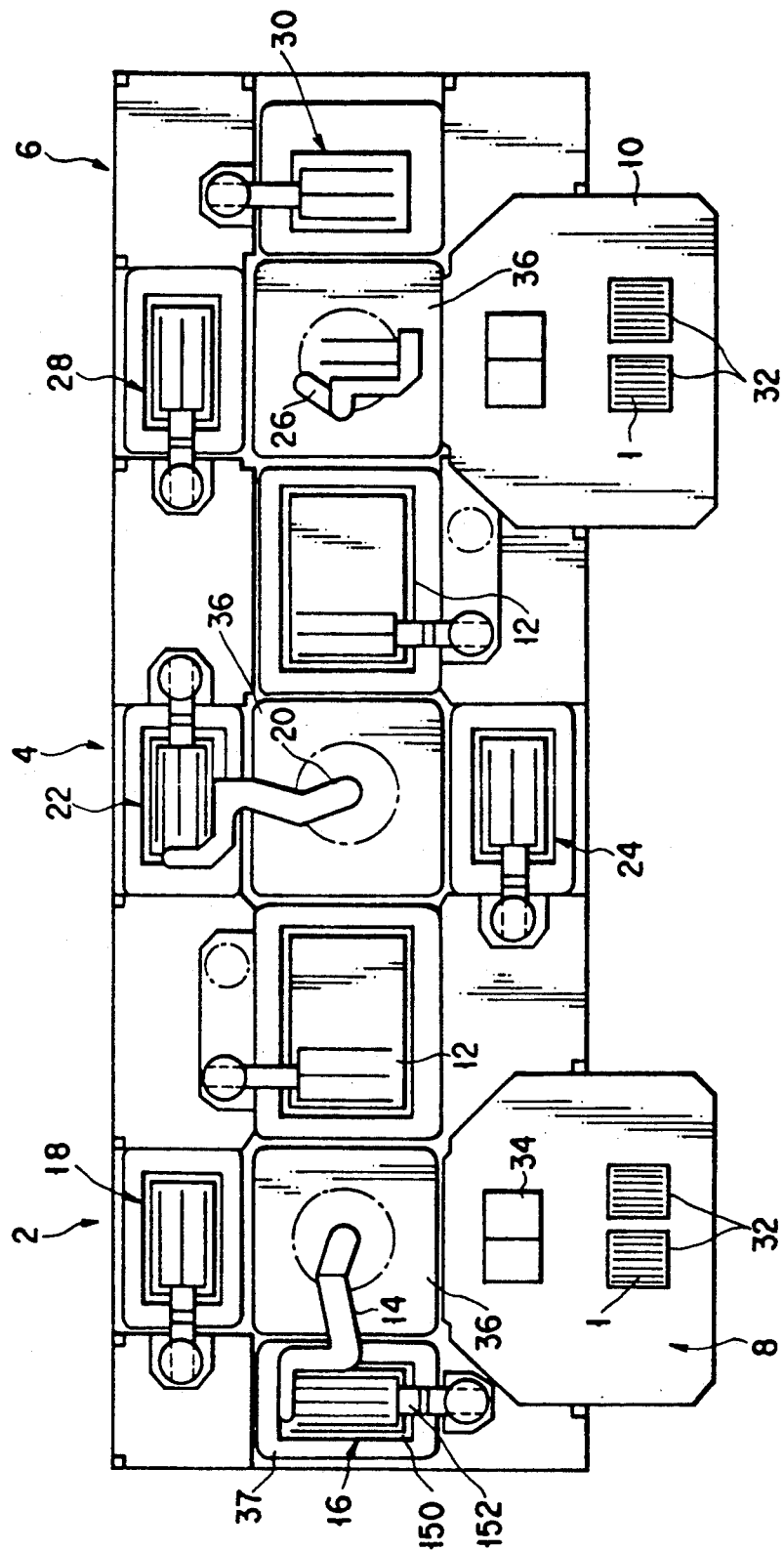
FIG. 1 is a plan showing the whole arrangement of the cleaning apparatus according to an embodiment of the present invention.

As shown in FIG. 1, the semiconductor wafers cleaning apparatus according to the present invention is a combination of three cleaning units 2, 4 and 6. A wafer loading unit 8 is connected to the process unit 2 located on the wafer loading side. A wafer unloading unit 10 is connected to the process unit 6 located on the wafer unloading side. Transfer units 12 which are combined with the three units, that is, the wafer loading unit 8 and the cleaning units 2 and 4 and with the other three units, that is, the wafer unloading unit 10 and the cleaning units 4 and 6 are arranged between the cleaning units 2 and 4 and between the cleaning units 4 and 6, respectively.

A first swing arm 14 for transferring semiconductor wafers 1 is arranged at the center of the cleaning unit 2 located on the wafer loading side. A cleaning tub 16 is located left the swing arm 14 and another cleaning tub 18 is located in opposite to the loading unit 8 with the swing arm 14 interposed between them.

According to this embodiment of the present invention, the cleaning tub 16 is used as a chemical treatment tub in which semiconductor wafers 1 are ammonia-treated, and the cleaning tub 18 is used as a quick dump rinse (QDR) tub in which semiconductor wafers 1 are water-washed.

A second swing arm 20 is arranged at the center of the cleaning unit 4 and the transfer units 12 are located left and right the second swing arm 20. Two cleaning tub 22 and 24 are also located in opposite to each other with the second swing arm 20 interposed between them. The cleaning tub 22 is used as a chemical treatment tub in which semiconductor wafers 1 are treated with hydrofluoric acid and the cleaning tub 24 is used as an overflow tub in which semiconductor wafers are water-washed.

A third swing arm 26 is arranged at the center of the cleaning unit 6 which is located on the wafer unloading side. A cleaning tub 28 is located in opposite to the unloading unit 10 with the third swing arm 26 interposed between them. A drying tub 30 is also located right the third swing arm 26. The cleaning tub 28 is used in this case as final rinse tub in which semiconductor wafers are water-washed.

Citing a transfer chamber 36 in which the first swing arm 14 is housed, it will be described how these transfer chambers in which the first, second and third swing arms 14, 20 and 26 are housed, respectively, are arranged.

Figure 2:
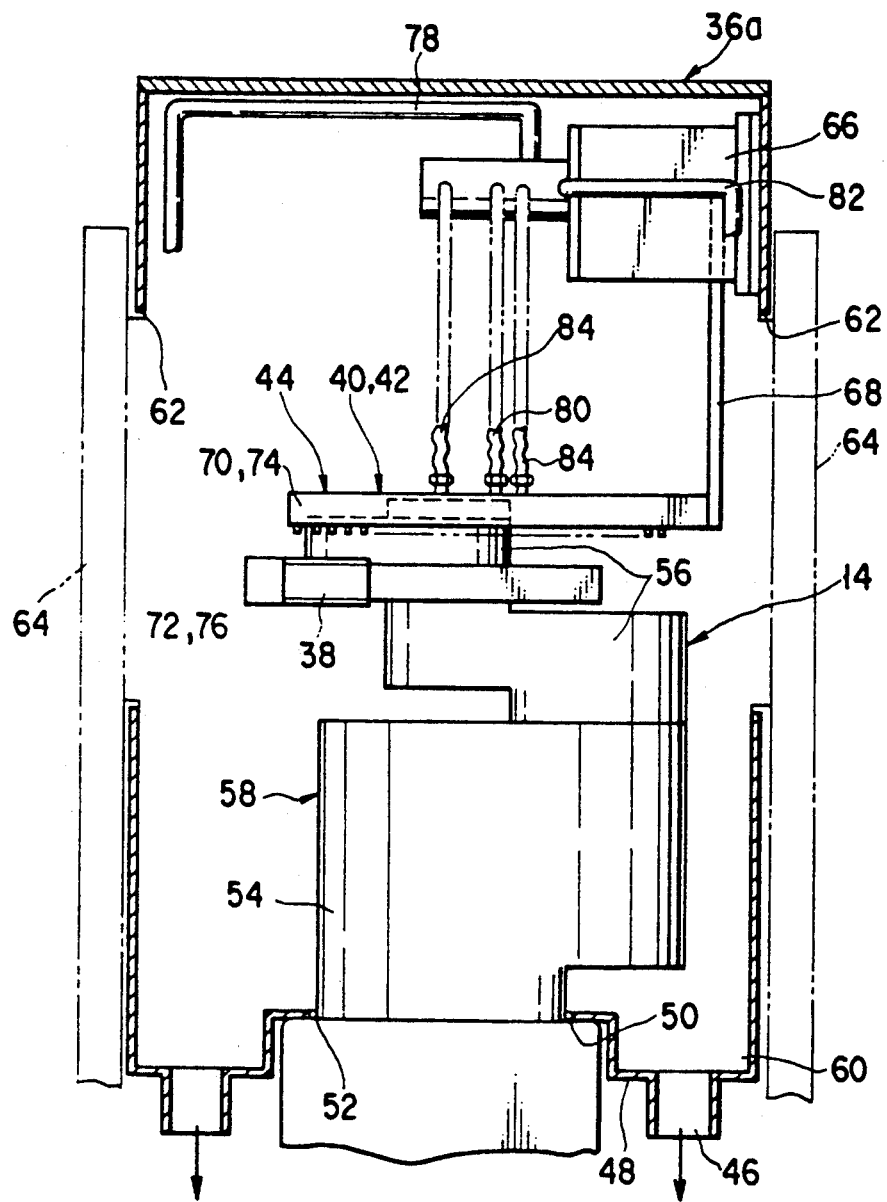
FIG. 2 is a front view, partly sectioned, showing a wafer transfer chamber of the cleaning apparatus.

As shown in FIG. 2, the transfer chamber 36 is a water-tight and corrosion resisting one 36a in which the first swing arm 14 is housed. A cleaning/drying nozzle section 44 having cleaning and drying nozzles 40 and 42, through which cleaning liquid (or pure water) and drying gas (or $N_2$ gas) are jetted against a semiconductor wafers holder of the swing arm 14, is located in an upper half of the transfer chamber 36a. The transfer chamber 36a has at a bottom 48 thereof treating liquid exhaust openings 46 through which waste liquid used to clean semiconductor wafers 1 is exhausted.

The swing arm 14 has an arm body 58, and forks 38 which form the semiconductor wafers holder. The arm body 58 comprises an arm base 54 inserted into an attachment hole 50 of the bottom 48 of the chamber 36a through an O-ring 52, and plural arm segments 56 attached, freely swingable relative to one another and movable up and down, to the top of the arm base 58. The forks 38 are attached to the front end of the top of the arm segments 56 and grooves in which semiconductor wafers 1 are seated are formed on each of the forks 38. These components or arm body 58 and forks 38 of the swing arm 14 are made of corrosion resisting vinyl chloride.

The chamber 36a is also made of the same corrosion resisting vinyl chloride as in the case of the swing arm 14. The bottom 48 of the chamber 36a is projected upward at the center portion thereof to form a ring-shaped groove 60 around it. The ring-shaped groove 60 has at two positions thereof the exhaust openings 46 through which cleaning liquid used to clean semiconductor wafers 1 is exhausted. The side wall of the chamber 36 has openings 62 through which semiconductor wafers 1 are carried in and out. These openings 62 can be opened and closed by shutters 64. When the openings 60 are closed by the shutters 64, therefore, the chamber 36a can be shut off from adjacent treating chambers 37 not to allow atmosphere in the chambers 37 to flow into the chamber 36a.

As shown in FIGS. 2 and 3, the cleaning/drying nozzle section 44 located in the upper half of the chamber 36a includes one cleaning nozzle 40 located at the center thereof and two drying nozzles 42 located on both sides of the cleaning nozzle 40. These nozzles 40 and 42 are arranged parallel to one another at the lower end portion of a rocking arm 68. The rocking arm 68 is attached to a rotary actuator 66 and this actuator 66 is fixed to the upper portion of the side wall of the chamber 36a. The nozzles 40 and 42 can be thus swung in the vertical direction by the rotary actuator 66.

Figure 4:
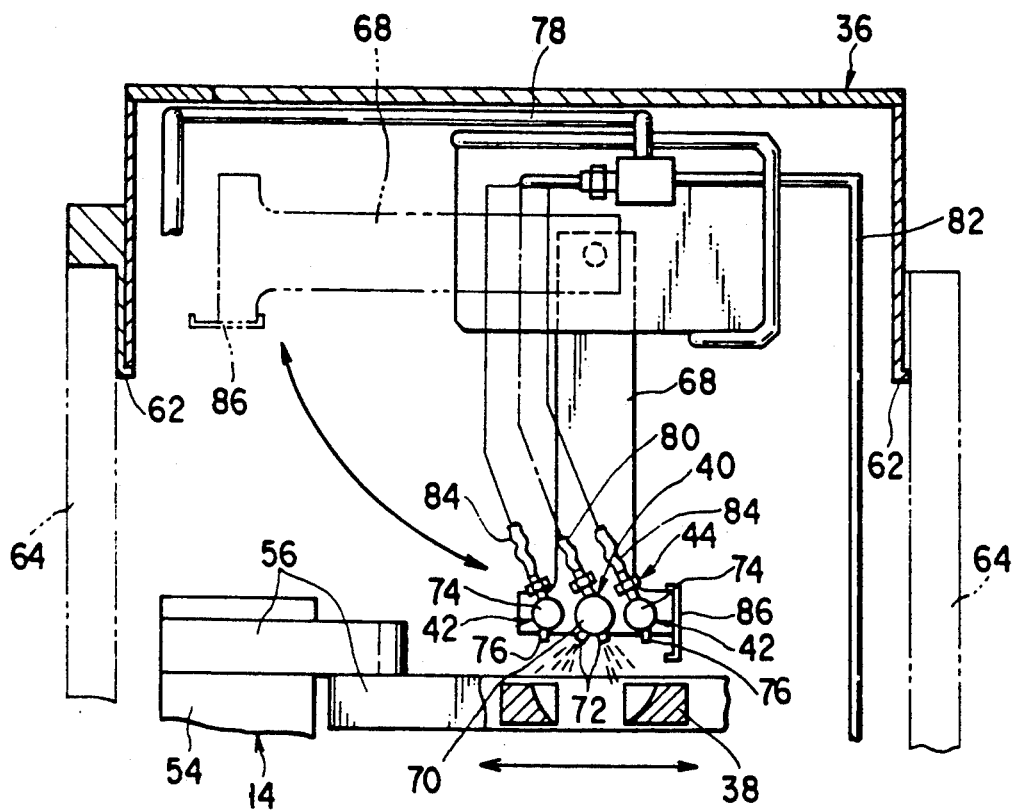
FIG. 4 is a rear view, partly sectioned, showing the wafer transfer chamber.
Figure 5:
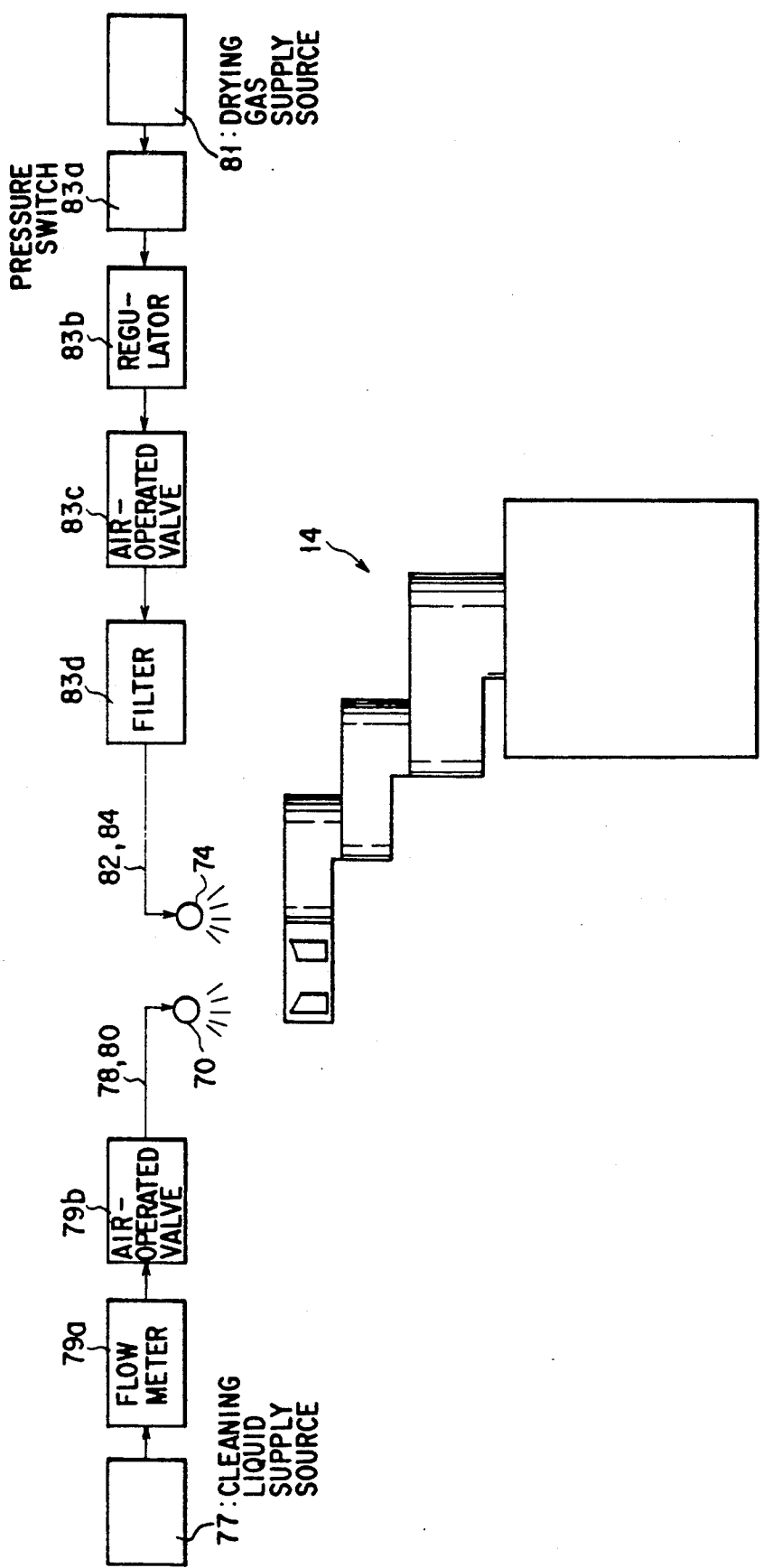
FIG. 5 is a block diagram showing cleaning liquid and drying air supply systems.

According to this embodiment, the cleaning nozzle 40 includes a cleaning pipe 70 connected to a cleaning liquid supply pipe 78 and a flexible tube 80, and a plurality of jetting outlets 72 formed along the lower side of the cleaning pipe 70, as shown in FIG. 4. These jetting outlets 72 are arranged in two rows and directed oblique and outward. Each of the drying nozzles 42 includes a drying pipe 74 connected to a is connected to a cleaning liquid supply source 77 via flow meter 79a and an air-operated valve 79b so as to supply pure cleaning water from the cleaning liquid supply source 77 to the cleaning pipe 70. The drying pipes 74 are connected to a drying gas supply source 81 via a pressure switch 83a, a regulator 83b, an air-operated valve 83c and a filter 83d so as to supply drying $N_2$ gas from the drying gas supply source 81 to the drying pipes 74.

When the forks 38 of the swing arm 14 are to be cleaned by the above-arranged cleaning/drying nozzle section 44, the rocking arm 68 is swung to the cleaning position. Pure water is then jetted against the forks 38 through the jetting outlets 72 of the cleaning nozzle 40 while supplying pure cleaning water from the cleaning liquid supply source 77 to the cleaning pipe 70, so that chemicals and impurities stuck to the forks 38 can be removed from the forks 38. After this cleaning is done for a certain time, the supply of pure cleaning water from the cleaning liquid supply source 77 is stopped. Drying $N_2$ gas is then supplied from the drying gas supply source 81 and jetted through the jetting outlets 76 of the drying nozzles 42 to dry the forks 38 for a short time. This enables the swing arm 14 to be kept clean whenever it is used to carry the semiconductor wafers 1. Dried or hot air may be used instead of $N_2$ gas.

When the rotary actuator 66 is made operative to swing the rocking arm 68 by 90 degrees after the cleaning and drying process is finished, the cleaning/drying nozzle section 44 is moved to an upper and side position of the chamber 36a and kept there not to disturb the semiconductor wafers carried in and out of the chamber 36a. A tray 86 is attached to one side of the front end of the rocking arm 68. When the cleaning/drying nozzle section 44 is moved to its waiting position, therefore, pure water dropped from the cleaning nozzle 40 can be collected in the tray 86.

The first, second and third swing arms 14, 20 and 26 will be described, citing the first swing arm 14 as an example.

Figure 7:
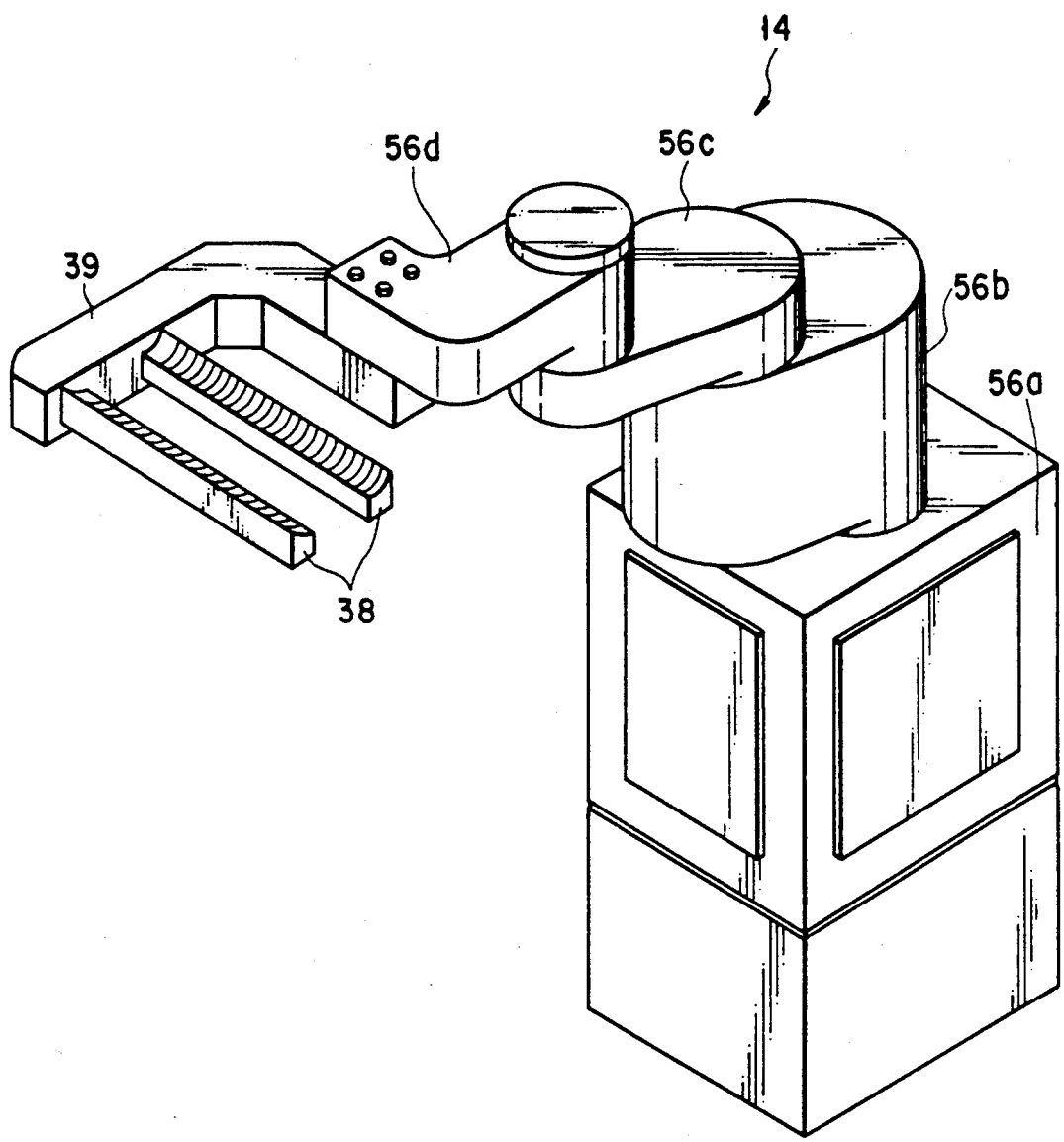
FIGS. 7 and 8 are perspective views showing the transfer robot arm.

As shown in FIGS. 6 and 7, the swing arm 14 is of the multi-joint type comprising plural arm segments 56a–56d which are connected, freely swingable, to one another. The top arm segment 56d includes a support member 39 from which the forks 38 are projected to hold the semiconductor wafers 1 thereon.

As shown in FIG. 9, the arm segments 56a–56d comprise hollow blocks 96a–96d made of vinyl chloride and connected to one another by hollow connecting shafts 90a–90c. Spaces 104a–104d in the blocks 96a–96d are communicated with one another through hollow portions 92a–92c and openings 98, 99 of the connecting shafts 90a–90c. A swing drive motor 91 is housed in the first arm segment 56a (arm base 54) and connected to a first pipe shaft 93a, which is attached to the second arm segment 56b, by a first belt 95a. When the swing drive motor 91 is rotated, therefore, the first pipe shaft 93a is also rotated via the first belt 95a to simultaneously swing the second, third and fourth arm segments 56b–56d.

Another motor 97 for driving the arms to be extended and shortened is located under the first pipe shaft 93a and it is connected to the lower end of the first connecting shaft 90a. This first connecting shaft 90a is supported, freely rotatable, in the second arm segment 56b. It is connected to the second connecting shaft 90b by a second belt 95b and to a second pipe shaft 93b, which is attached to the third arm segment 56c, by a third belt 95c. Further, the second connecting shaft 90b is extended, freely rotatable, into the third arm segment 56c and connected to the third connecting shaft 90c by a fourth belt 95d. The third connecting shaft 90c is fixed to the fourth arm segment 56d. When the drive motor 97 is rotated, therefore, the first connecting shaft 90a is also rotated and this rotation of the first connecting shaft 90a is transmitted to the second connecting and pipe shafts 90b and 93b through the belts 95b and 95c. As the result, the third arm segment 56c is rotated while the rotation transmitted to the second connecting shaft 90b is further transmitted to the third connecting shaft 90c via the fourth belt 95d. The third and fourth arm segments 56c and 56d can be thus rotated at the same time and in the same direction.

As shown in FIG. 6, the connecting shaft 90a in the first arm segment 56a is provided with a ventilation hole 98 communicated with the hollow portion 92a thereof. An N₂ gas supply unit 102 is communicating with the ventilation hole 98 via a supply pipe 100 and a valve 101. N₂ gas is therefore supplied from the N₂ gas supply unit 102 to the space 104a in the first arm segment 56a through the supply pipe 100. It then flows into the hollow portion 92a of the connecting shaft 90a through the ventilation hole 98 and further into the space 104b in the adjacent arm segment 56b through the hollow portion 92a, so that the space 104b in the second arm segment 56b can be kept pressurized. N₂ gas is finally introduced into the space 104d, passing through the hollow portions 92b and 92c in the connecting shafts 90b and 90c. The spaces 104c and 104d in the third and fourth arm segments 56c and 56d can be thus kept pressurized. This prevents chemical liquid and others, which have adhered to the swing arm 14, from entering into drive sections in the swing arm 14. Dried or hot air may be used instead of N₂ gas.

Seal systems are provided at connecting sections where the arm segments 56a–56d are connected to their adjacent ones. The seal system provided between the first arm segment 56a and the second one 56b will be described as an example.

As shown in FIG. 10, a cylindrical fixing shaft 106 which extends into the hollow block 96b of the second arm segment 56b is fixed to the hollow block 96a of the first arm segment 56a. A sleeve 108 made of fluorine resin is fitted onto the fixing shaft 106. An O-ring 50 is interposed between the sleeve 108 and the block 96a and a seal member 112 made of synthetic rubber is also interposed between the block 96b and the sleeve 108. The drive sections in the swing arm 14 can be thus sealed from a space 105 in the transfer chamber 36.

An O-ring groove 117 is formed on that face of the block 96a of the first arm segment 56a which is contacted with the bottom 48 of the chamber 36a, and an O-ring 116 is arranged in the O-ring groove 117. The hollow block 96b which serves as the second arm segment 56b also has an O-ring 118 at its connected area. The space 104b in the second arm segment 56b can be thus kept air-tight. The pipe shaft 93a in which the first connecting shaft 90a is loosely held is supported, freely rotatable, in the cylindrical fixing shaft 106 through bearings 120.

The chamber 36a which serves as the transfer chamber 36 is a container made of vinyl chloride and it has at its side wall 126, which is adjacent to the cleaning chamber 37, the opening 62 through which the swing arm 14 is carried in and out together with the semiconductor wafers 1, as shown in FIG. 6. An upper rectifying member 132 which is a porous plate made of vinyl chloride and an HEPA (or ULPA) filter 134 are attached to an open top of the chamber 36a and an air supply passage is connected to the chamber 36a through these rectifying member 132 and the filter 134. An air supply fan 136 is arranged in the air supply passage. Clean air A can be thus supplied into the chamber 36a through the filter 134 and the rectifying member 132 by the fan 136. The shutter 64 is provided to freely open and close the opening 62 of the chamber 36a and an air outlet (not shown) is formed along the top of the opening 62 to provide an air curtain over the opening 62.

As already described above, the bottom 48 of the chamber 36a is projected upward at the center portion thereof to form the ring-shaped groove 60 around its projected center portion. The ring-shaped groove 60 has air/liquid exhaust openings 46 at two positions thereof. A suction means (not shown) is connected to these air/liquid exhaust openings 46 through exhaust pipes 142 and an air/liquid separating section 144 is attached to the exhaust pipes 142 on the way thereof. Further, a porous plate 146 made of vinyl chloride is arranged a little above the bottom 48 of the chamber 36a. The down flow of clean air flowing in the chamber 36a can be kept laminar by the porous plate 146. In addition, the porous plate 146 prevents air and liquid stayed on the bottom 48 of the chamber 36a from again floating upward in the chamber 36a.

According to this embodiment of the present invention, clean air A supplied into the chamber 36a through the open top thereof is kept laminar by the porous plate 146 and then exhausted outside the chamber 36a through the air/liquid exhaust openings 46. Atmosphere in the chamber 36a can be thus kept clean. In addition, chemical liquid and impurities adhering to the swing arm 14 can be prevented from scattering into the chamber 36a. Further, N₂ gas with which the hollow blocks 96a–96d are kept pressurized can be prevented from leaking to disturb atmosphere in the chamber 36a. This enables the semiconductor wafers 1 to be carried in the chamber 36a while being kept clean.

It will be described how the above-described cleaning apparatus according to the present invention is operated.

When two carriers 32 each holding 25 sheets of the semiconductor wafers 1 therein are carried to the loader 8, the orifla aligning system (not shown) is made operative to align the semiconductor wafers 1 in each of the carriers 32. Push rods (not shown) are then moved upward to release the semiconductor wafers 1 upward from the carriers 32. The push rods then cooperate with one another to position 50 sheets of the semiconductor wafers 1 at a certain interval.

Figure 8:
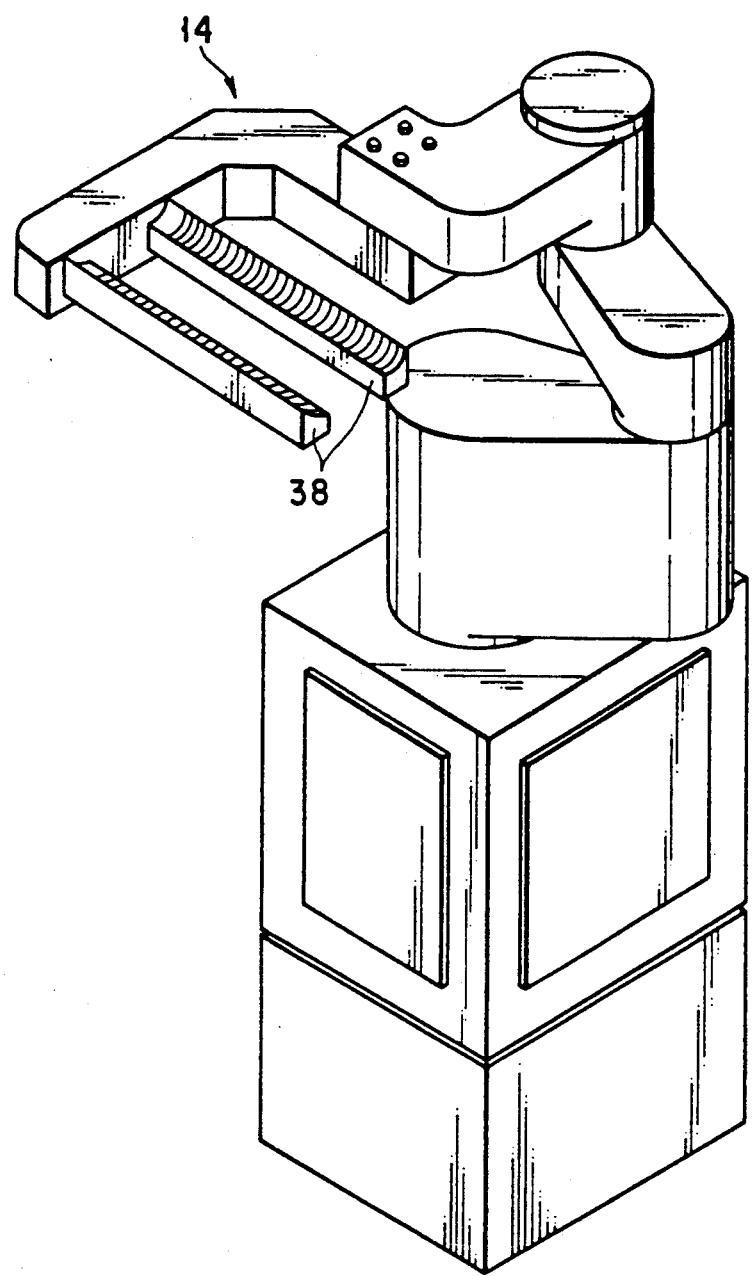

The swing arm 14 is then made operative and swung in the horizontal direction, extending its arms to the loader 8 while changing their state shown in FIG. 8 to that shown in FIG. 7. The forks 38 attached to the front end of the top arm segment can be thus positioned under the push rods. The push rods are lowered and the semiconductor wafers 1 are thus held and positioned on the forks 38.

The swing arm 14 is further swung in the horizontal direction, holding the semiconductor wafers 1 on the forks 38 while shortening its arms from their state shown in FIG. 7 to that shown in FIG. 8. Thereafter, it carries the semiconductor wafers into the ammonia-treating chamber 37 through the opening 62, while extending and shortening its arms, and mounts them on a boat 152 used exclusively for the ammonia liquid 150. When the swing arm 14 comes out of the ammonia-treating chamber 37, the opening 62 of the chamber 37 is closed by the shutter 64 and air is blown through the air outlet along the top of the opening 62 to provide the air curtain over the opening 62. Atmosphere in the ammonia-treating chamber 37 can be thus prevented from leaking outside the chamber 37. The semiconductor wafers are cleaned under this state in the ammonia-treating chamber 37.

When the forks 38 of the swing arm 14 are returned from the ammonia-treating chamber 37 into the chamber 36a, the rotary actuator 66 is made operative to move the cleaning/drying nozzle section 44 above the forks 38. Pure water is supplied from the cleaning liquid supply source 77 to the cleaning nozzle 40 and jetted against the forks 38 through the jetting outlets 72 of the cleaning nozzle 40, so that ammonia and other impurities which have adhered to the forks 38 can be removed from the forks 38. Pure water used is stayed on the bottom 48 of the chamber 36a and exhausted outside the chamber 36a through the exhaust openings 46.

After the forks 38 are washed and cleaned in this manner, the supply of pure water from the cleaning liquid supply source 77 is stopped. $N_2$ gas is then supplied from the drying gas supply source 81 to the drying nozzles 42 and jetted against the forks 38 through the jetting outlets 76 of the drying nozzles 42, so that the forks 38 which have been made wet by the cleaning can be dried. The rotary actuator 66 is then swung in the reverse direction to return the cleaning/drying nozzle section 44 to its waiting position. The forks 38 are cleaned for five minutes and dried for another five minutes and these cleaning and drying of the forks 38 are carried out during the forks-waiting time (about 10 minutes) when the semiconductor wafers are treated in the ammonia-treating chamber 37.

The spaces 104a–104d in the arm segments of the swing arm 14 are filled with $N_2$ gas. Therefore, chemical liquid and others can be prevented from entering into the drive sections of the swing arm 14 and the swing arm 14 itself can be prevented from becoming eroded. Further, clean air supplied into the chamber 36a through the open top thereof can be kept laminar by the porous plates 132 and 146, flowing like a down flow in the chamber 36a, and exhausted outside the chamber 36a through the air/liquid exhaust openings 46 of the chamber bottom 48. Atmosphere in the chamber 36a can be thus kept clean at all times.

When the cleaning of the semiconductor wafers is finished in the ammonia-treating chamber 37, the semiconductor wafers on the boat 152 are mounted and positioned on the forks 38 of the swing arm 14 and carried out of the ammonia-treating tub 16 of the chamber 37 and then into the next water-washing tub 18, which process is reverse to that already described above. The forks 38 of the swing arm 14 returned from the waterwashing tub 18 are cleaned and dried in the same manner as described above by the cleaning/drying nozzle section 44. The swing arm 14 can be thus made ready for carrying 50 sheets of next semiconductor wafers 1. As apparent from the above, the swing arm 14 can be cleaned and dried when it is kept waiting for carrying the semiconductor wafers. In addition, chemical liquid and others can be prevented from entering into its drive sections. This enables groups of semiconductor wafers to be cleaned continuously and at a higher efficiency. Further, it is housed in the watertight and corrosion resisting chamber 36a. Waste liquid used to clean the swing arm 14 can be thus safely exhausted without scattering outside the chamber 36a.

Furthermore, the swing arm 14 is in such atmosphere in the chamber 36a that has been made clean by the down flow of clean air. And this atmosphere in the chamber 36a cannot be contaminated by chemical liquid adhering to the swing arm 14 and by waste liquid used to clean the swing arm 14 because they can be safely exhausted outside the chamber 36a. The atmosphere in the chamber 36a cannot be contaminated by $N_2$ gas filled in the spaces 104a–104d in the arm segments because $N_2$ gas, even if leaked, can be forced downward by the down flow of clean air supplied. The swung arm 14 can be thus kept clean at all times.

When the cleaning of the semiconductor wafers is finished at the cleaning unit 2 located on the wafers loading side, the wafers are carried to the center water-washing unit 4 by the loader 12 located between these two units 2 and 4. They are then carried, same as described above, by the second swing arm 20 housed in the transfer chamber 36 in the center water-washing unit 4. In short, they are cleaned in the hydrofluoric acid treating tub 22 and then over-flowed by water in the overflow tub 24. In the case of the center cleaning unit 2, too, the forks 38 of the second swing arm 20 are cleaned and dried in the same manner as described above by the cleaning/drying nozzle section 44 while the second swing arm 20 is kept waiting.

When the cleaning of the semiconductor wafers is finished at the center cleaning unit 4, the wafers are carried to the next cleaning unit 6 by the loader 12 located between these units 4 and 6. They are then carried, same as described above, by the third swing arm 26 at the cleaning unit 6 located on the wafers unloading side. In short, they are finally rinsed in the tub 28 and dried in the drying tub 30. Also in the case of the cleaning unit 6, the forks 38 of the third swing arm 26 are cleaned and dried in the same manner as described above by the cleaning/drying nozzle section 44, so that the third swing arm can be kept clean and used under this state to carry semiconductor wafers.

Finally, the semiconductor wafers which have been made clean at the cleaning unit 6 are carried to the unloader 10. They are then divided into two groups, each comprising 25 sheets of the semiconductor wafers, and orifla-aligned by the unloader 10 and mounted on and carried by two carriers.

Although the present invention has been applied to the semiconductor wafers cleaning apparatus in the above-described case, it may be applied to other apparatuses, for example, the one for cleaning LCD glass substrates.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A cleaning apparatus comprising:
    a cleaning unit having cleaning tubs in which cleaning liquid is contained;
    means for carrying matters to be processed into and out of the cleaning unit and having matters-holding members;
    a chamber in which the carrying means is housed; and
    means located in an upper portion of the chamber to clean and dry the holding members of said carrying means, said cleaning and drying means including cleaning and drying nozzles through which cleaning liquid and dried air are jetted against the holding members of said carrying means.

2. The cleaning apparatus according to claim 1, further comprising means formed in the bottom of said chamber to exhaust cleaning liquid and drying air therethrough.

3. The cleaning apparatus according to claim 2, further comprising means for keeping clean air flowing downward through a horizontal plane in said chamber at a same speed.

4. The cleaning apparatus according to claim 3, wherein said keeping means includes a clean air rectifying member arranged on a plane perpendicular to the down flow of clean air in said chamber.

5. The cleaning apparatus according to claim 1, further comprising means attached to an open top of said chamber to create a down flow of clean air in the chamber.

6. The cleaning apparatus according to claim 5, wherein said down flow creating means includes an air supply opening at the top of said chamber, a filter covering the air supply opening and means for supplying air into the chamber through the air supply opening.

7. The cleaning apparatus according to claim 1, wherein said chamber is made air-tight and corrosion resisting.

8. The cleaning apparatus according to claim 1, wherein said carrying means has plural arm segments connected freely swingable to one another and made by hollow air-tight blocks.

9. The cleaning apparatus according to claim 8, wherein said carrying means includes means for driving the arm segments and means housed in the hollow blocks to transmit drive force to the arm segments.

10. The cleaning apparatus according to claim 9, further comprising means for supplying pressurized gas into one of the hollow blocks and means for distributing the pressurized gas into the other hollow blocks to keep all of them pressurized.

11. The cleaning apparatus according to claim 10, wherein said force transmitting means has a hollow shaft for connecting the two arm segments adjacent to each other and spaces in the arm segments are communicated with each other through the hollow connecting shaft.

* * * * *